United States Patent [19]

Barna et al.

[11] Patent Number: 5,512,130
[45] Date of Patent: Apr. 30, 1996

[54] METHOD AND APPARATUS OF ETCHING A CLEAN TRENCH IN A SEMICONDUCTOR MATERIAL

[75] Inventors: Gabriel G. Barna, Richardson; James G. Frank, Garland; Richard P. VanMeurs, Austin; Duane E. Carter, Plano, all of Tex.

[73] Assignee: Texas Instruments Incorporated, Dallas, Tex.

[21] Appl. No.: 209,750

[22] Filed: Mar. 9, 1994

[51] Int. Cl.$^6$ .................................................... H01L 21/00
[52] U.S. Cl. ............................ 156/651.1; 156/643.1; 156/662.1; 156/653.1; 216/67
[58] Field of Search ............................. 156/643, 646, 156/662, 345, 65 D, 651, 653; 216/67

[56] References Cited

U.S. PATENT DOCUMENTS

| 4,349,409 | 9/1982 | Shibayama et al. | 156/643 |
| 4,617,079 | 10/1986 | Tracy et al. | 156/643 |
| 4,784,720 | 11/1988 | Douglas | 156/643 |
| 4,808,259 | 2/1989 | Jillie et al. | 156/643 |
| B1 4,464,223 | 4/1991 | Gorin | 156/643 |

OTHER PUBLICATIONS

Mark Stark and Leslie Giffen, "Silicon Trench Etching in the 1500", *Tegal Process Review*, vol. I, No. 1, May 1984, pp. 8–9.

Stephen P. DeOrnellas and Joseph D. Ocampo, "The Etching of Silicon in a Multi-Frequency Discharge Reactor", Lam Research Corporation, 47531 Warm Springs Blvd., Fremont, Calif. 94539.

J. Keller, L. Giffen, D. Uchimura, G. Corn, "A Dual Frequency Tri-Electrode System for Etching Polysilicon", *Mat. Res. Soc. Symp. Proc.*, vol. 38, 1985 Materials Research Society, pp. 243–246.

*Primary Examiner*—R. Bruce Breneman
*Assistant Examiner*—George Goudreau
*Attorney, Agent, or Firm*—Mark E. Courtney; W. James Brady, III; Richard L. Donaldson

[57] ABSTRACT

An etching apparatus (10) includes a process chamber (12) partially surrounded by an upper electrode (14) and a lower electrode (16). A semiconductor material (18) lies within the process chamber (12) and in contact with the lower electrode (16). The lower electrode (16) is connected to a first power supply (22) operating at a substantially high frequency and is also connected to a second power supply (24) operating at a relatively low frequency. The lower frequency of the second power supply (24) provides a degree of anisotropic control to the trench etching process performed on the semiconductor material (18). The added anisotropic control allows for the elimination of sidewall deposition enhancing materials within a plasma chemistry introduced into the process chamber (12) by a gas distributor (20). Without the requirement of a sidewall deposition enhancing material during trench etching of the semiconductor material (18), buildup of residue due to sidewall deposition does not occur within process chamber (12).

16 Claims, 1 Drawing Sheet

METHOD AND APPARATUS OF ETCHING A CLEAN TRENCH IN A SEMICONDUCTOR MATERIAL

TECHNICAL FIELD OF THE INVENTION

The present invention relates in general to semiconductor fabrication processes and more particularly to a method and apparatus of etching a clean trench in a semiconductor material.

BACKGROUND OF THE INVENTION

Plasma etching of trenches in silicon has developed considerably for use in higher density integrated circuits. Silicon trenches are used to isolate active devices from each other and in the formation of vertical capacitors. A number of commercially available plasma etchers offer trench etching processes. These plasma etchers vary in their chemistry and in the type of reaction chambers employed. Conventional plasma etchers have resulted in higher throughputs as well as better control over critical etch parameters required in the trench etching process.

There are at least two major problems in conventional trench etching techniques. The first problem is in etching the correct profile at a fast enough rate to be of practical use. There are etch chemistries that are capable of providing a correct profile at a sufficiently fast rate, however, these etch chemistries result in the second problem in conventional trench etching. The second problem is that appropriate etch chemistries typically leave a considerable amount of residue within the plasma process chamber. To maintain proper etching requirements, the etch chamber must be opened and mechanically cleaned and then reconditioned after the cleaning step. This clean up process of the etch chamber leads to a significant increase in chamber downtime and thus a decrease in etching throughput.

Therefore, it is desirable to have a trench etching technique that performs at a sufficiently fast rate and overcomes the buildup of residue within the process chamber as found in conventional trench etching techniques.

SUMMARY OF THE INVENTION

From the foregoing, it may be appreciated that a need has arisen for a trench etching apparatus that provides a reasonably fast etch rate. A need has also arisen for an etching technique that can be performed without a buildup of residue within the process chamber.

In accordance with the present invention, a method and apparatus for etching a clean trench in a semiconductor material are provided which substantially eliminate or reduce disadvantages and problems associated with conventional trench etching techniques.

According to an embodiment of the present invention, there is provided a method of etching a clean trench in a semiconductor material that includes applying a first power supply to an electrode of a process chamber, wherein the first power supply is operating at a first frequency. A second power supply is also applied to the electrode and operates at a second frequency. A plasma chemistry is then introduced within the process chamber to form a trench within the semiconductor material.

The method and apparatus of the present invention provide various technical advantages over conventional trench etching techniques. For example, one technical advantage is in applying two power supplies having different frequencies to the same electrode. Another technical advantage is in forming a trench in a semiconductor material without producing a buildup of sidewall deposition in the trench or residue within the process chamber. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
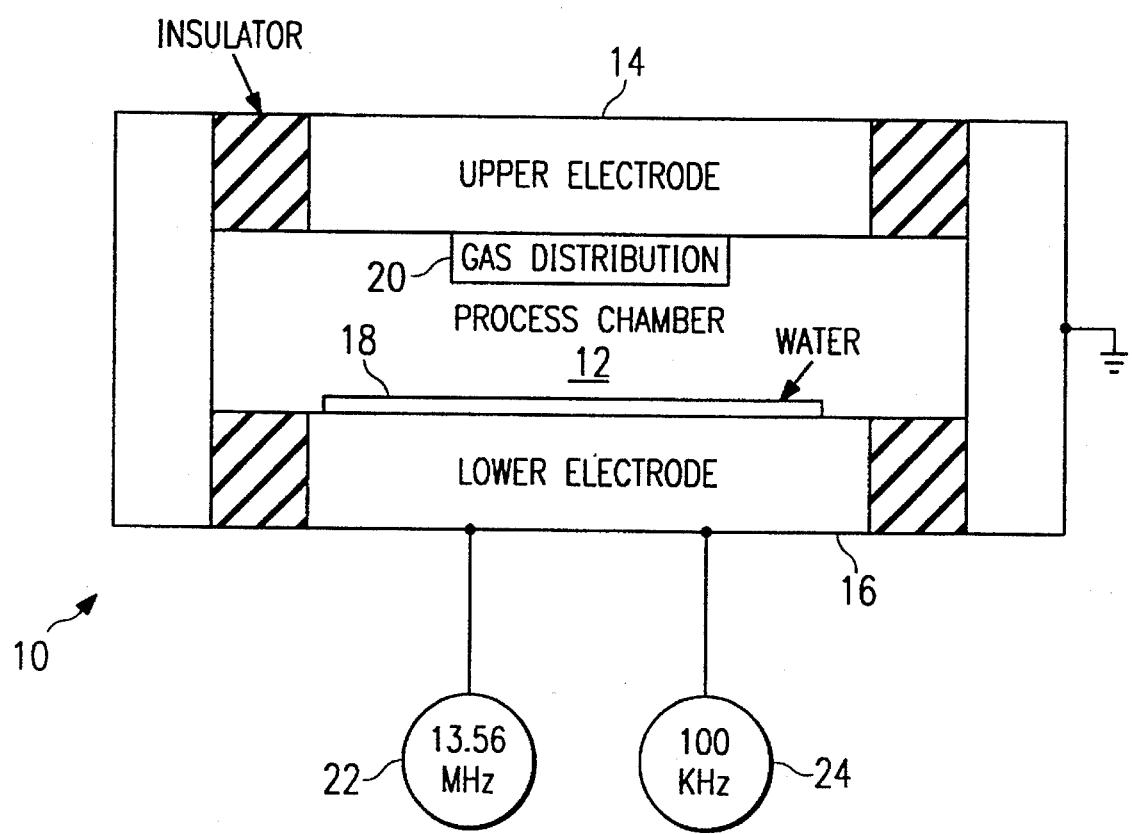
FIG. 1 illustrates a process chamber for etching trenches in a semiconductor material.

FIG. 1 is a block diagram of an etching apparatus 10. Etching apparatus 10 includes a process chamber 12 surrounded in part by an upper electrode 14 and a lower electrode 16. A semiconductor material 18, such as a wafer, is in contact with lower electrode 16 within process chamber 12. A gas distributor 20 provides gas distribution of appropriate plasma chemistries to process chamber 12 in order to form trenches within semiconductor material 18. A first power supply 22 having a relatively high frequency is connected to lower electrode 16. A second power supply 24 having a relatively low frequency is also connected to lower electrode 16.

In operation, first power supply 22 and second power supply 24 are both applied to lower electrode 16 to create a dual frequency configuration. First power supply 22 preferably operates at a frequency of 13.56 MHz and second power supply 24 preferably operates at a frequency of 100 KHz. The lower frequency of second power supply 24 provides an additional degree of anisotropic control based on increased ion energies and increased sheath fields. Anisotropic ion trajectories are obtainable at the lower frequency of second power supply 24 as compared to the higher frequency of first power supply 22. The dual frequency configuration of etching apparatus 10 allows for the enhancement of the etch rate unavailable in single frequency systems.

The anisotropic control characteristic of low frequency power supply 24 in the dual frequency configuration is useful in maintaining the cleanliness of process chamber 12 during trench etching of semiconductor material 18. With the anisotropic control of the low frequency power supply 24, certain materials in the plasma chemistry used to enhance sidewall deposition and the anisotropy of the trench etch are no longer required. The sidewall deposition enhancing materials contain nitrogen or oxygen that produce the buildup of residue within process chamber 12, requiring a costly and time consuming cleanout of etching apparatus 10. The low frequency power supply 24 of the dual frequency configuration allows for the removal of sidewall deposition enhancement materials from the plasma chemistry and thus the elimination of residue buildup from process chamber 12 during trench etching of semiconductor material 18.

A plasma chemistry used to etch trenches in semiconductor material 18 without leaving any residue buildup within process chamber 12 preferably includes hydrogen bromide and boron trichloride materials. Table I shows the process parameters and values for each process step in etching a trench within semiconductor material 18. The process steps were performed in a PAC 150R reactor operating in the RIE mode.

TABLE I

| PROCESS 1 | STEP #1 | Step #2 |
|---|---|---|
| Pressure (torr) | 0.250 | 0.200 |
| RF/13.56 MHz (W) | 500 | 200 |
| RF/100 KHz | 0 | 50 |
| HBr (sccm) | 124 | 71 |
| $BCl_3$ (sccm) | 16 | 5 |
| $V_{dc}$ | −914 | −289 to −562 |
| Time (sec) | 30 | 600 |

RESULTS
Etch rate 0.78 microns/min
Oxide selectivity 15.5:1
Aspect ratio 7:1 (good profile)

The first step in Process 1 is a high power step used to sputter through any surface oxide film. This first step ensures uniformity of the trench etch throughout the bulk etch performed by the second step. The main drawback of Process 1 is the relatively slow etch rate of semiconductor material 18.

To enhance the etch rate of semiconductor material 18, chlorine $CL_2$ is included in the plasma chemistry. Table II shows the parameters and values used in each step of Process 2.

TABLE II

| PROCESS 2 | STEP #1 | STEP #2 | STEP #3 |
|---|---|---|---|
| Pressure (torr) | 0.285 | 0.285 | 0.170 |
| RF/13.56 MHz (W) | 325 | 325 | 50 |
| RF/100 KHz | 50 | 50 | 50 |
| HBr (sccm) | 133 | 133 | 0 |
| $BCl_3$ (sccm) | 17 | 17 | 13 |
| $CL_2$ (sccm) | 0 | 5 | 30 |
| $V_{dc}$ | −515 | −515 | −523 |
| Time (sec) | 30 | 90 | 165 |
| He chuck pressure (torr) | 5 | 5 | 5 |
| Substrate temperature (deg. C.) | 2 | 2 | 2 |

RESULTS
Etch rate 1.25 microns/min
Oxide selectivity 20:1
Nonuniformity (%) 5
Aspect ratio 4.5:1 (good profile)

The addition of chlorine provides a fifty percent increase in the etch rate of semiconductor material 18. No visible residue buildup occurs in process chamber 12. Although not intentionally created, there still may be a sidewall deposit in the trenches of semiconductor material 18. This sidewall deposit, if any, can be eliminated by adding a one minute, ten percent hydrogen fluoride dip step to Process 2.

In summary, an etching apparatus has two power supplies connected to a lower electrode. The first power supply operates at a substantially higher frequency than the second power supply. The lower frequency of the second power supply adds a degree of anisotropic control to the trench etching of a semiconductor material within the etching apparatus. This anisotropic control eliminates the need for sidewall deposition during the etching of trenches within the semiconductor material. The plasma chemistry used to etch trenches within the semiconductor material no longer requires a sidewall deposition enhancing material and thus avoids the buildup of residue within the process chamber of the etching apparatus.

Thus, it is apparent that there has been provided, in accordance with the present invention, a method and apparatus for etching a clean trench in a semiconductor material that satisfies the advantages set forth above. Although the preferred embodiment has been described in detail, it should be understood that various changes, substitutions, and alterations can be made herein. For example, different plasma chemistries and power supply frequencies may be used along with variations in process step parameters and values to maintain the etch rate of a semiconductor material and the cleanliness of the process chamber. Other examples are readily ascertainable by one skilled in the art and could be made without departing from the spirit and scope of the present invention as defined by the following claims.

What is claimed is:

1. A method of etching in a semiconductor material, comprising the steps of:

providing a process chamber and placing said semiconductor material on a first electrode in said process chamber;

applying a first power supply to said first electrode of said process chamber at a first power level, the first power supply operating at a first frequency;

simultaneously applying a second power supply to said first electrode at a second power level, the second power supply operating at a second frequency;

introducing a plasma chemistry within the process chamber to selectively etch the semiconductor material;

allowing said plasma chemistry to etch said semiconductor material for a predetermined time period while said first and second power supplies are applied;

subsequently applying said first power supply operating at said first frequency at a third power output level, said third power output level being lower than said first power level;

simultaneously applying said second power supply operating at said second frequency at a fourth power output level which is higher than said second power output level; and allowing said plasma chemistry to etch said semiconductor material for a second predetermined time period while said first and second power supplies are applied at said third and fourth power output levels, respectively.

2. The method of claim 1, wherein the plasma chemistry contains materials that do not produce a buildup of sidewall deposition on one or more trenches formed in said semiconductor material by said selective etching or residue within the process chamber.

3. The method of claim 1, wherein the first frequency is substantially greater than the second frequency to provide anisotropic control of the etching of said semiconductor material.

4. The method of claim 1, wherein the second frequency generates higher ion energies and higher sheath fields as compared to the first frequency.

5. The method of claim 2, wherein the plasma chemistry includes hydrogen bromide and boron trichloride.

6. The method of claim 2, wherein the plasma chemistry includes chlorine to enhance the etching rate.

7. The method of claim 1, further comprising the step of:

placing the selectively etched semiconductor material in a solution to remove any sidewall deposit buildup in the one or more trenches formed in the semiconductor material.

8. The method of claim 7, wherein said solution includes hydrogen and fluorine.

9. A method of etching a semiconductor material within a process chamber, comprising the steps of:

providing an electrode within said process chamber which supports the semiconductor material;

executing the first part of a two part process on said semiconductor material for a first predetermined time period, wherein the first part comprises the steps of:

(a) applying a first power supply at a first predetermined level to said electrode of a process chamber, the first power supply operating at a first frequency;

(b) simultaneously applying a second power supply to the electrode at a second power output level, the second power supply operating at a second frequency, the first frequency being substantially greater than the second frequency to provide anisotropic control of the trench etching; and (c) introducing a plasma chemistry within the process chamber to selectively etch said semiconductor material, the plasma chemistry containing materials that do not produce a buildup of sidewall deposition on areas etched away within said semiconductor material or residue within the process chamber; and subsequently executing the second part of said two part process on said semiconductor material for a second predetermined time period, wherein said second part comprises the steps of:

(d) applying said first power supply operating at said first frequency at a third power level;

(e) applying said second power supply operating at said second frequency at a fourth power level; and (f) etching said semiconductor material a second time by exciting said plasma chemistry with the energies from said first and second power supplies.

10. The method of claim 9, wherein said first power output level is at least ten times said second power output level.

11. The method of claim 9, wherein the plasma chemistry contains materials that do not include nitrogen or oxygen.

12. The method of claim 9, wherein the first frequency is at least a factor of 100 greater than the second frequency.

13. The method of claim 9, further comprising the step of:

varying an amount of power applied by the first and second power supplies to control an etch rate for the selective etch of said semiconductor material.

14. The method of claim 9, wherein said third power output level is less than said first power output level.

15. The method of claim 14, wherein said fourth power output level is less than said third power output level.

16. A method of etching a semiconductor material within a process chamber, comprising the steps of:

providing a process chamber having at least one electrode, said semiconductor material being placed on said electrode;

providing a plasma chemistry within said process chamber, said plasma chemistry comprising hydrogen bromide and boron trichloride;

executing a three part etching process, wherein the first part comprises the steps of:

(a) applying a high frequency power supply to said electrode at a first power output level;

(b) simultaneously applying a low frequency power supply to said electrode at a second power output level; and (c) allowing said plasma chemistry to etch said semiconductor material while being excited by said high and low frequency power supplies for a predetermined time period;

subsequently executing the second part of said three part process, wherein said second part comprises the steps of:

(d) adding chlorine to said plasma chemistry;

(e) applying said high frequency power supply to said electrode at said first power output level;

(f) simultaneously applying said low frequency power supply to said electrode at said second power output level; and (g) allowing said plasma chemistry to etch said semiconductor material while being excited by said high and low frequency power supplies for a second predetermined time period; and subsequently executing the third part of said three part process, wherein said third part comprises the steps of:

(h) removing the hydrogen bromide from said plasma chemistry;

(i) applying said high frequency power supply to said electrode at a third power output level;

(j) simultaneously applying said low frequency power supply to said electrode at fourth power output level; and (k) allowing the plasma chemistry to etch the semiconductor material while being excited by said high and low frequency signals for a third predetermined time period.

* * * * *